United States Patent
Chiu et al.

(10) Patent No.: US 9,214,539 B2
(45) Date of Patent: Dec. 15, 2015

(54) GALLIUM NITRIDE TRANSISTOR WITH A HYBRID ALUMINUM OXIDE LAYER AS A GATE DIELECTRIC

(71) Applicant: Taiwan Semiconductor Manufacturing Co., Ltd., Hsin-Chu (TW)

(72) Inventors: Han-Chin Chiu, Kaohsiung (TW); King-Yuen Wong, Tuen Mun, N.T. (HK); Cheng-Yuan Tsai, Chu-Pei (TW); Chia-Shiung Tsai, Hsin-Chu (TW); Xiaomeng Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/016,328

(22) Filed: Sep. 3, 2013

(65) Prior Publication Data

US 2015/0060861 A1   Mar. 5, 2015

(51) Int. Cl.
*H01L 29/10* (2006.01)
*H01L 29/778* (2006.01)
*H01L 29/66* (2006.01)
*H01L 29/20* (2006.01)
*H01L 29/04* (2006.01)

(52) U.S. Cl.
CPC ............ *H01L 29/7787* (2013.01); *H01L 29/04* (2013.01); *H01L 29/2003* (2013.01); *H01L 29/66462* (2013.01)

(58) Field of Classification Search
CPC .................. H01L 29/66477; H01L 29/66659; H01L 29/7835
See application file for complete search history.

(56) References Cited

PUBLICATIONS

Yugang Zhou, et al.; "Gate Leakage in AlGaN/GaN HEMTs and its Suppression by Optimization of MOCVD Growth"; Department of Electrical and Electronic Engineering, Hong Kong University of Science and Technology; Phys. Stat. Sol., No. 7, 2663-2667, 2005.
Dawei Yan, et al.; "On the Reverse Gate Leakage Current of AlGaN/GaN High Electron Mobility Transistors"; Applied Physics Letters, 2010, p. 1-4.
Ozaki, et al. "Effect of Oxidant Source on Threshold Voltage Shift of AlGaN/GaN MIS-HEMTs Using ALD-Al2O3 Gate Insulator Films." CS MANTECH Conference, Boston, Massachusetts, USA, Apr. 23rd-26th, 2012.
Dingemans, et al. "Influence of the Oxidant on the Chemical and Field-Effect Passivation of Si by ALD Al2O3." Electrochemical and Solid-State Letters, 14 (1) H1-H4. Oct. 21, 2010.
Kim, et al. "Low Temperature (<100°C) Deposition of Aluminum Oxide Thin Films by ALD with O3 as Oxidant." Journal of the Electrochemical Society, 153 (5) F69-F76, Mar. 8, 2006.

*Primary Examiner* — Elias M Ullah
(74) *Attorney, Agent, or Firm* — Eschweiler & Associates, LLC

(57) ABSTRACT

Some embodiments of the present disclosure relates to a hybrid gate dielectric layer that has good interface and bulk dielectric properties. Surface traps can degrade device performance and cause large threshold voltage shifts in III-N HEMTs. This disclosure uses a hybrid ALD (atomic layer deposited)-oxide layer which is a combination of H2O-based and O3/O2-based oxide layers that provide both good interface and good bulk dielectric properties to the III-N device. The H2O-based oxide layer provides good interface with the III-N surface, whereas the O3/O2-based oxide layer provides good bulk properties.

20 Claims, 7 Drawing Sheets

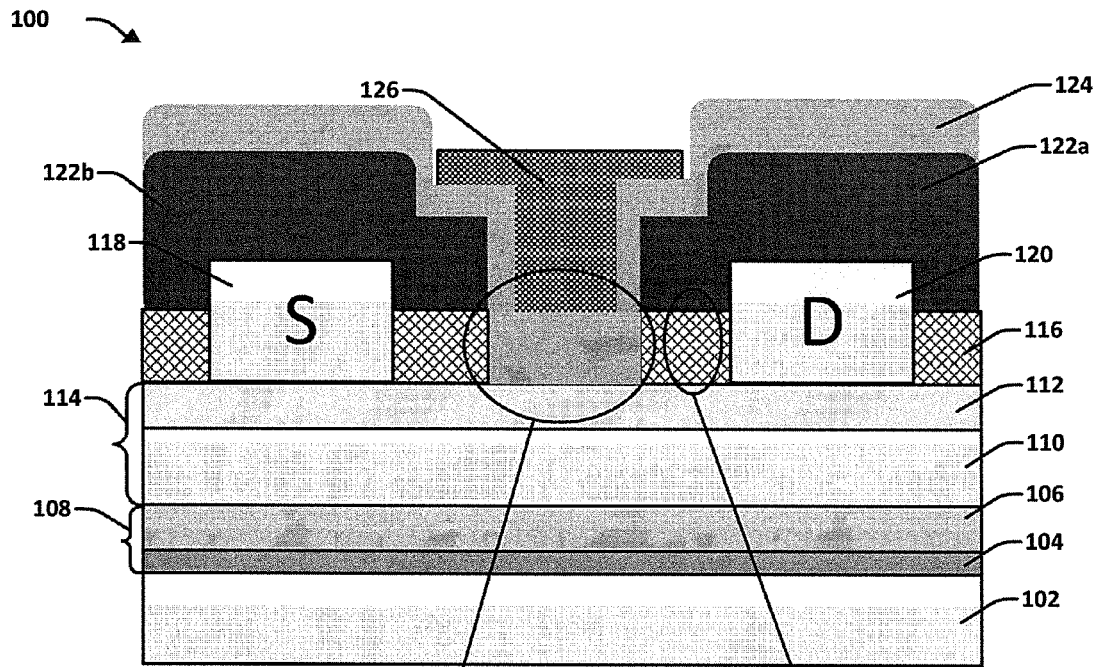
FIG. 1
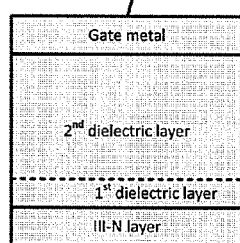
Hybrid gate
dielectric layer
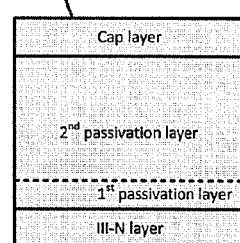
Hybrid passivation
layer

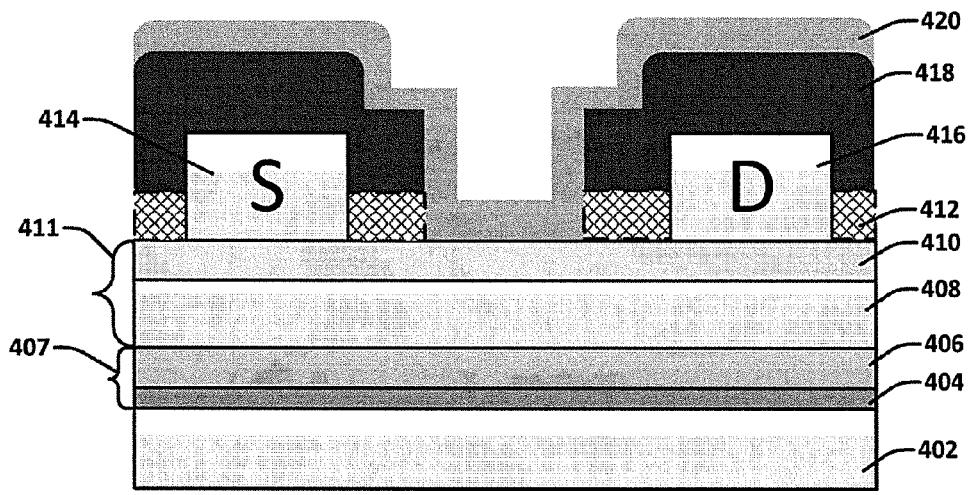
FIG. 4f
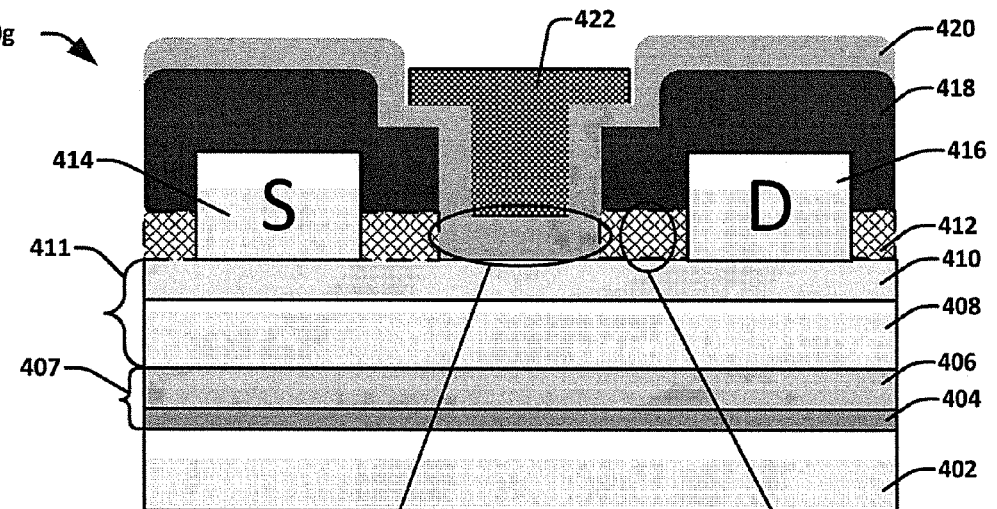
FIG. 4g
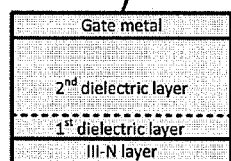
Hybrid gate
dielectric layer
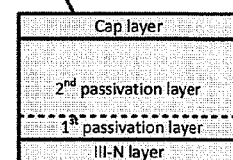
Hybrid
passivation layer

US 9,214,539 B2

GALLIUM NITRIDE TRANSISTOR WITH A HYBRID ALUMINUM OXIDE LAYER AS A GATE DIELECTRIC

FIELD

The present disclosure relates to the formation of a hybrid oxide layer as the gate dielectric for GaN MISFETS.

BACKGROUND

High-electron-mobility transistors (HEMTs), also known as heterostructure FETs (HFETs) or modulation-doped FETs (MODFETs), are field-effect transistors incorporating a junction between two materials with different band gaps (i.e. a heterojunction) as the channel instead of a doped region (as is generally the case for MOSFETs). III-N (tri nitride) devices, such as AlGaN/GaN devices, are one type of HEMT that show very promising performance in high-power and high-frequency applications. III-N devices can be used, for example, in high power-high frequency applications such as emitters for cell phone base stations, Direct Broadcast Satellite (DBS) receivers, electronic warfare systems, etc.

BRIEF DESCRIPTION OF THE DRAWINGS

FIG. 1 shows some embodiments of a cross sectional view of a III-N HEMT device with a hybrid gate dielectric layer and a hybrid passivation layer formed in accordance with the present disclosure.

FIGS. 4a-4g show a series of cross-sectional views that collectively depict a detailed method for manufacturing a depletion mode high mobility transistor (HEMT) device having a hybrid gate dielectric layer and a hybrid passivation layer according to some embodiments of the disclosure.

DETAILED DESCRIPTION

Figure 2:
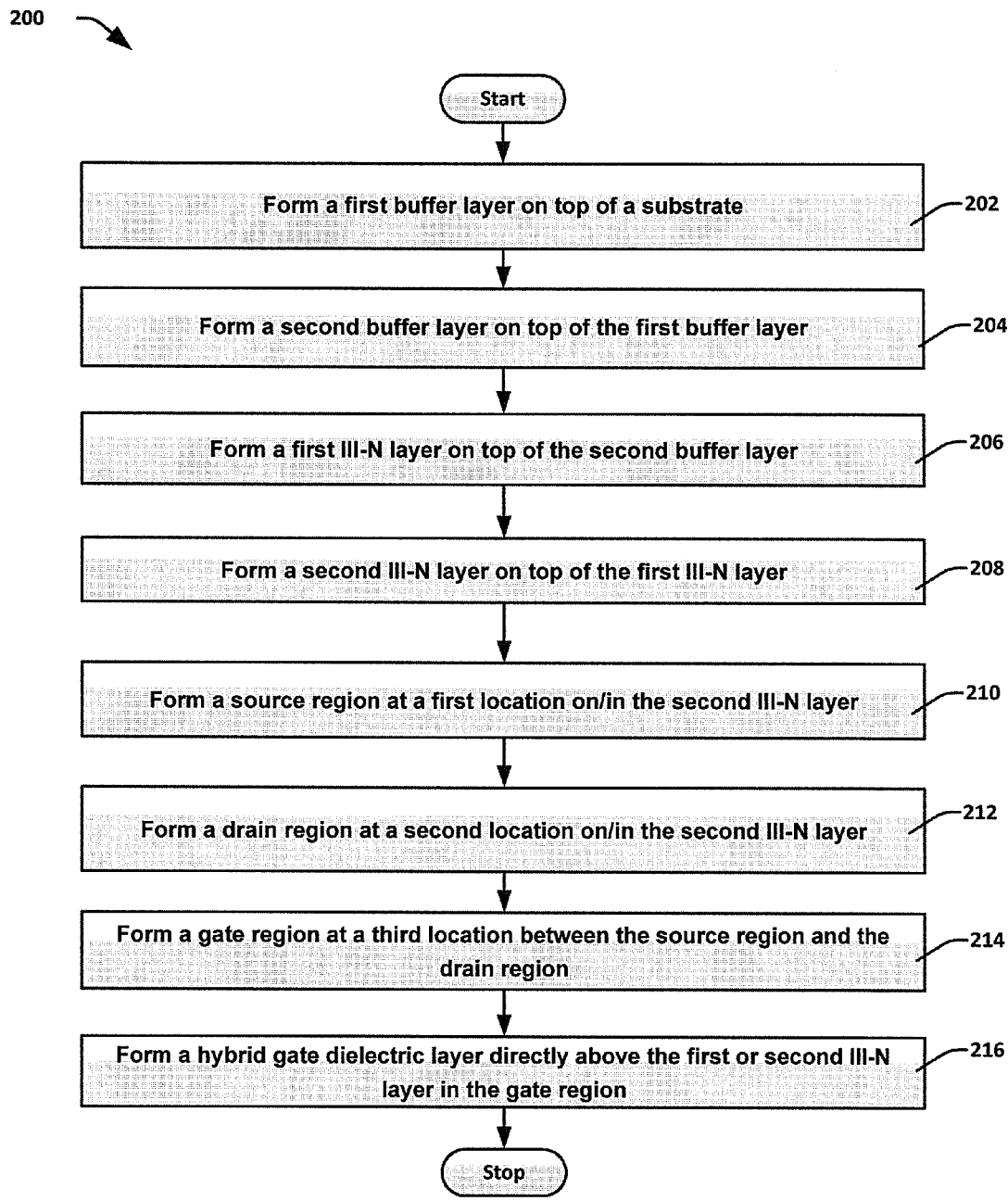
FIG. 2 shows a flow diagram of a method according to some embodiments of the present disclosure.

Some aspects of the present disclosure relate to hybrid gate dielectric layer that provides improved interface with III-nitride surfaces as well as good bulk dielectric properties.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

As mentioned, a HEMT device uses a heterojunction between two materials with different band gaps as a channel. For example, in some III-N HEMT devices, a wide bandgap AlGaN layer can form a heterojunction with a narrow bandgap GaN layer. A buried channel is formed at the top of GaN layer close to AlGaN layer. In practice, however, the surface states of the top III-N layer which is exposed to air after deposition are generally created by un-passivated dangling bonds, poor bonding of native oxide, and ions absorbed from the ambient environment. These states trap electrons injected by the gate and create a layer of charge at or near the surface that depletes the channel in the high field region between the gate and drain.

These unavoidable traps in the AlGaN/GaN heterostructures affect breakdown voltage, promote gate leakage current and are a main source of current dispersion between static and dynamic current-voltage characteristics. From a physical point of view, the degradation, and hence changes observed with the device, arise from defects under the gate region. These changes become more evident at a critical point in the magnitude of the electric field. In field-effect devices, quantum mechanical tunnelling has been shown to be an important effect to be accounted for. For example, electrons tunnelling from the gate can create a gate-to-drain leakage current by hopping from trap to trap. Alternatively, the electrons can accumulate on the surface next to the gate or move through the AlGaN layer to the conducting channel. Hence, the gate leakage current surges as a consequence of surface trap issues.

In an attempt to limit the number of traps, reduce gate leakage and thereby improve device performance, the present disclosure sets forth techniques where a hybrid gate dielectric layer is formed on a III-N surface that provides both good interface and good bulk dielectric properties. This hybrid dielectric layer is an oxide that comprises two layers with different H/OH content. The first layer (H2O-based), which is in contact with the III-N surface has a higher H/OH content and it provides better interfacial properties, whereas the second layer, that has a lower H/OH content (O3-based) will provide a better bulk quality. For example, in a device with atomic layer deposited (ALD) Al2O3 as the gate dielectric, H2O-based Al2O3 can get lower interfacial density of states (Dit) which will cause less Vt (threshold voltage) shift than an O3-based Al2O3. However, H2O-based Al2O3 has poor bulk quality which may induce higher leakage than O3-based Al2O3. Hence, this disclosure is to deposit an ALD-Al2O3 layer with a relatively thin H2O-based Al2O3 as the initial layer for better interfacial composition, followed by a relatively thick O3 or O2 plasma-based Al2O3 as the main dielectric body. Thus, good interface and good bulk dielectric properties are both realized with this hybrid gate dielectric layer.

FIG. 1 shows some embodiments of a cross sectional view of a III-N HEMT device 100 with a hybrid gate dielectric layer and a hybrid passivation layer formed in accordance with the present disclosure. The HEMT device 100 has a buffer layer 108 which is arranged on top of a substrate 102. In the illustrated embodiment, the substrate 102 may be Si, SiC or sapphire. The buffer layer 108 may comprise single or multiple III-N layers which help in nucleation and thermal expansion and which reduce lattice mismatch. In the illustrated embodiment, the buffer layer 108 comprises a first buffer layer 104, such as an AlN layer, and a second buffer layer 106, such as an AlGaN layer. A heterojunction structure 114 comprising a first semiconductor layer 110, which has a first bandgap, and a second semiconductor layer 112, which has a second different bandgap, is arranged on top of the buffer layer 108. A two dimensional electron gas (2-DEG) (not shown) is formed near the heterojunction interface between the first semiconductor layer 110 and the second semiconductor layer 112. In some embodiments, the first semiconductor layer 110 comprises a first III-N layer (e.g., GaN) and the second semiconductor layer 112 comprises a second III-N layer (e.g., AlGaN). The first and second semiconductor layers may be monocrystalline or polycrystalline.

A source metal contact or source region 118 and a drain metal contact or drain region 120 are arranged at first and second regions (e.g., opposing ends) of the second III-N layer 112. In some embodiments, the source and drain contacts can extend deeper in to the second semiconductor layer 112 and reside at some level within the depth of the second semiconductor layer 112 or extend further in to the 2DEG channel at the interface between the first semiconductor layer 110 and the second semiconductor layer 112. In some embodiments, the source contact 118 and the drain contact 120 are formed by selectively depositing metals like Ti/Al/Ni/Au. On top of the second III-N layer 112 resides a hybrid passivation layer 116. This hybrid passivation layer has a first passivation layer that is H2O based, having high H/OH content, and a second passivation layer on top of the first passivation layer which is O3/O2-based having lower H/OH content. The relatively thin H2O based first passivation layer, which is in contact with the III-N surface, provides a good interface with the underlying III-N surface and reduces the number of interface traps in the III-N dielectric junction, whereas, the relatively thick second passivation layer, which comprises one or more than one kind of oxide stacks, provides good bulk dielectric properties such as resistance against dopant diffusion, thermal stability, maintenance of a high mobility of charge carriers in the channel etc. The first passivation layer has a thickness in a range of about 1 nm to about 20 nm and the second passivation layer has a thickness in a range of about 10 nm to about 150 nm. This hybrid passivation layer provides passivation for the 2DEG channel and mainly helps in reducing a leakage path from the 2DEG channel to the top surface. The hybrid passivation layer 116 is seen in all regions except the source, drain and gate regions, above the second III-N layer 112. A cap layer 122a resides above the drain contact 120 and the hybrid passivation layer 116 in the drain region. Another cap layer 122b resides above the source contact 118 and the hybrid passivation layer 116 in the source region. The cap layer protects the device from out-diffusion that may occur due to the high temperature processes that follows. The cap layer 122a, 122b can be deposited by low temperature deposition methods like PECVD (plasma enhanced chemical vapor deposition), PVD (physical vapor deposition) or ALD (atomic layer deposition). For example, the cap layer can comprise Silicon Nitride (SiNx) or Silicon Oxide (SiOx) with a thickness ranging from 5 nm to 100 nm.

A hybrid gate dielectric layer 124 is formed above the cap layers 122a and 122b in the drain and source regions respectively and directly on top of the second III-N layer 112 in the gate region. The hybrid gate dielectric layer comprises two separate layers that have different H/OH content. The hybrid gate dielectric layer includes a first dielectric layer having a relatively high H/OH content and a second dielectric layer (which comprises one or more than one kind of oxide stacks), that resides on top of the first dielectric layer having a lower H/OH content. The first dielectric layer is H2O based and provides a very good interface between the III-N layer and the dielectric whereas the second dielectric layer is O3/O2 based which provides good bulk dielectric properties. The first dielectric layer has a thickness in a range of about 1 nm to about 20 nm and the second dielectric layer has a thickness in a range of about 10 nm to about 50 nm. In various embodiments, the hybrid gate dielectric layer 124 may comprise Ga2O3, SiO2, Al2O3, MgO, Ga2O3, La2O3, HfO2, ZrO2, Y2O3, Gd2O3, Ce2O3, Ta2O3 or Ta2O5 with two different H/OH contents and thicknesses. Finally, a gate electrode 126 is deposited over the hybrid gate dielectric layer 124 in the gate region.

During operation, a voltage applied to the gate electrode 126 controls the flow of carriers (e.g., 2-D electron gas) from the source 118 to the drain 120 through a channel region in the heterojunction 114. Thus, whether the HEMT 100 is in a conductive or resistive state can be controlled by controlling the 2DEG with the help of the gate electrode 126. In many cases HEMT devices are enhancement mode devices, which operate similar to silicon MOSFET devices by normally being in a non-conducting state (normally off). Due to the nature of the AlGaN/GaN interface, and the formation of the 2DEG at the interface of AlGaN and GaN materials in HEMTs, such devices that are formed in the 111-N materials system tend to be normally on, or depletion mode devices. i.e.; the high electron mobility of the 2DEG at the interface of the AlGaN/GaN layers permits the III-N device, such as a HEMT device, to conduct without the application of a gate potential. However, a normally off AlGaN/GaN HEMT can be realized with the help of a hybrid gate dielectric layer which will later be described in detail.

FIG. 2 illustrates a flow diagram of some embodiments of a method 200 for formation of a semiconductor structure according to an embodiment of the disclosure. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a first buffer layer is formed on top of a substrate. In some embodiments the buffer layer comprises an AlN nucleation layer having a thickness in a range of about 150 nm to about 300 nm that is disposed above a Si substrate and is formed via MOCVD or MBE.

At 204, a second buffer layer is formed on top of the first buffer layer. In some embodiments a thermal expansion layer of AlGaN is disposed above the first buffer layer of AlN and formed via MOCVD or MBE.

At 206, a first III-nitride layer is formed on top of the second buffer layer. In some embodiments the first III-N layer comprising a GaN layer, is disposed above the AlGaN buffer layer. The GaN layer may comprise a doped GaN (UID-GaN) layer, usually referred as unintentionally doped (e.g., a GaN material not having intentionally placed dopants, but rather having a doping resulting from process contaminants, for example). In one embodiment, the UID-GaN layer may have an n-type doping.

At 208, a second III-nitride layer or electron supply layer is formed on top of the first III-nitride layer. This layer has a band gap that is bigger than that of the first III-N layer so that the heterojunction created by different band-gap materials forms a quantum well (a steep canyon) in the conduction band on the first III-N layer side, creating a high electron mobility channel. In some embodiments, the second III-nitride layer comprises a relatively thin film of aluminum gallium nitride (AlGaN) having a band gap that is larger than the band gap of the underlying GaN layer (e.g., AlGaN has a band gap of approximately 4 eV, while GaN has a band gap of approximately 3.4 eV). In some embodiments, the thin film of AlGaN may be intentionally doped to have an n-type doping that provides carriers to the 2-DEG.

At 210, a source region or source metal contact is formed at a first location in/on the second III-N layer. In some embodiments, the source contact is formed by selectively depositing metals like Ti, Al, Ni, Au or a combination of such metals.

At 212, a drain region or drain metal contact is formed at a second location in/on the second III-N layer. The second location is laterally disposed and separated from the source region. In some embodiments, the drain contact is formed by selectively depositing metals like Ti, Al, Ni, Au or a combination of such metals.

At 214, a gate region is formed at a third location on the first III-N layer (enhancement mode) or the second III-N layer (depletion mode) between the source region and the drain region.

At 216, a hybrid gate dielectric layer having two portions, wherein the first portion has an H/OH content that differs from an H/OH content of the second portion, is formed directly above the first III-N layer or the second III-N layer in the gate region. The hybrid gate dielectric layer should have a band gap that is larger than the bandgap of the AlGaN layer or GaN layer underneath.

Figure 3:
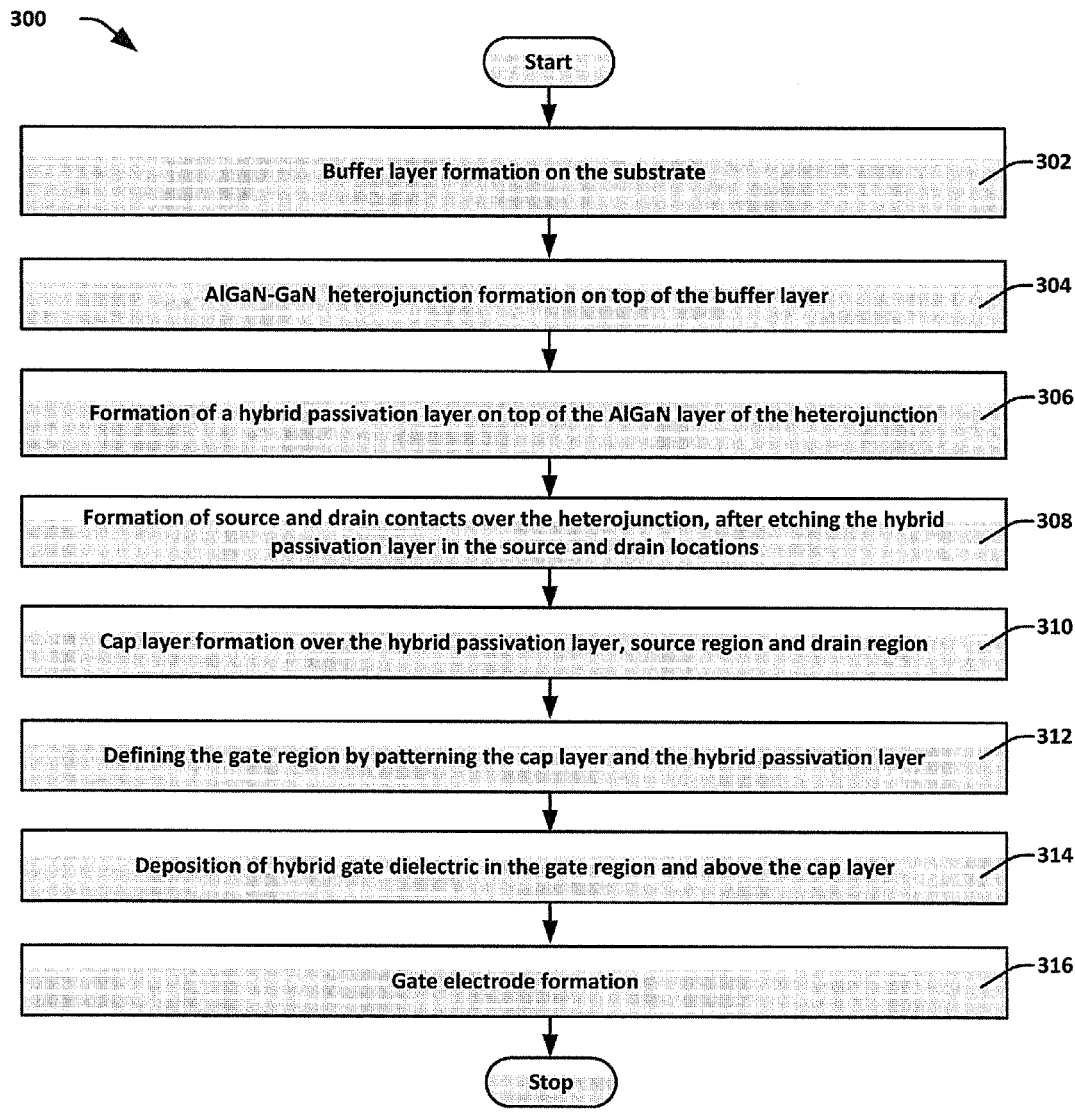
FIG. 3 shows a flow diagram of a method according to some embodiments of the present disclosure.

FIG. 3 illustrates a flow diagram of some embodiments of a method 300 for formation of a semiconductor structure, according to an embodiment of the disclosure. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 302, a buffer layer is formed on the substrate. In some embodiments, the substrate could be Si, SiC or sapphire. The buffer layer may comprise single or multiple III-N layers which help in nucleation and thermal expansion and which reduce lattice mismatch.

At step 304, an AlGaN/GaN heterojunction is formed above the buffer layer. Due to the difference in band gaps of AlGaN and GaN layers and the nature of the III-N heterojunction, a 2DEG channel will be formed at the top region of the GaN layer, right below the AlGaN layer, near the interface.

At step 306, a hybrid passivation layer is deposited on top of the AlGaN layer of the heterojunction. This passivation layer comprises two different layers with different H/OH content that provide better interface and bulk properties than conventional passivation layers. Furthermore, this hybrid passivation layer passivates the 2DEG region by suppressing 2DEG channel depletion and tunneling effects due to surface traps.

At step 308, source and drain regions or source and drain metal contacts are formed at separate locations on the AlGaN layer of the AlGaN/GaN heterojunction. These regions/contacts are formed following a patterning/etching of the hybrid passivation layer, in those desired source and drain locations, which creates openings for depositing the desired metals.

At step 310, a cap layer is deposited all over the hybrid passivation layer covering the source and drain contacts. In some embodiments, the cap layer can be deposited by low temperature deposition methods like PECVD (plasma enhanced chemical vapor deposition), PVD (physical vapor deposition) or ALD (atomic layer deposition).

At step 312, a gate region is defined in between the source and drain regions, by etching the cap layer and the hybrid passivation layer in that desired region. To create a depletion mode (normally on) AlGaN/GaN HEMT, the patterning step or lithography step that creates the gate region would include, etching the cap layer and the hybrid passivation layer in the gate region. However, in another embodiment, where an enhancement mode (normally-off) AlGaN/GaN HEMT needs to be created, etching would remove the AlGaN layer under the hybrid passivation layer as well.

At step 314, a hybrid gate dielectric layer is deposited all over the semiconductor body, which abuts the AlGaN layer (for a depletion mode HEMT) or GaN layer (for an enhancement mode HEMT) in the gate region, and the top surface of the cap layer in the remaining regions. The hybrid gate dielectric layer comprises a relatively thin H2O based first dielectric layer and a relatively thick O3/O2 based second dielectric layer that resides on top of the first dielectric layer. The high H/OH content in the first dielectric layer makes it a layer that shares a good interface with the underlying III-N surface and the low H/OH content second dielectric layer makes it a layer with good dielectric bulk properties. In some embodiments, the hybrid gate dielectric layer could be an ALD (atomic layer deposited) oxide (e.g. Al2O3), which may be formed in a single chamber with the same precursor (e.g., TMA (tetramethyl aluminum)) and different reactants (e.g., water vapor, O3, O2-plasma). Examples of the materials that may be used as the hybrid gate dielectric layer are Ga2O3, SiO2, Al2O3, MgO, Ga2O3, La2O3, HfO2, ZrO2, Y2O3, Gd2O3, Ce2O3, Ta2O3 or Ta2O5.

At step 316, a gate electrode or gate metal contact is formed in the gate region by depositing suitable metals.

Figure 4A:
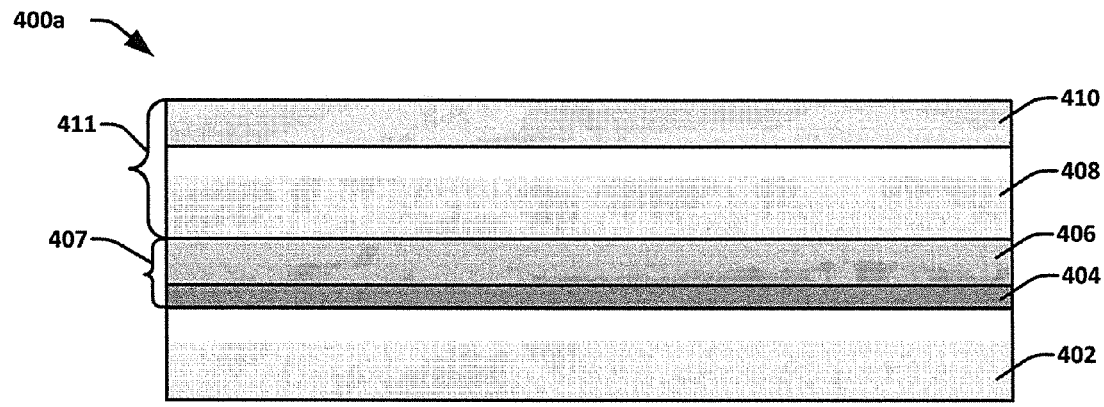

FIGS. 4a-4g show a series of cross-sectional views that collectively depict the detailed method 300 for manufacturing a depletion mode high mobility transistor (HEMT) device having a hybrid gate dielectric layer according to some embodiments of the disclosure. FIG. 4a shows some embodiments of a cross sectional view of a semiconductor body 400a, that has a buffer layer and a III-N heterojunction over a substrate. The method 300 starts at FIG. 4a where a substrate 402 is provided. The substrate can be a Si, SiC or sapphire substrate. A buffer layer 407, which in the illustrated embodiment comprises a first buffer layer 404 and a second buffer layer 406, is formed over the substrate. The first buffer layer 404 reduces strain between the substrate 402 and overlying layers. In some embodiments, the first buffer layer 404 comprises AlN. In some embodiments, first buffer layer 404 may have a thickness in a range of between approximately 150 nm to approximately 300 nm. In various embodiments, the second buffer layer 406 comprises an aluminum gallium nitride (AlGaN) layer the AlGaN layer may comprise a chemical formula of $Al_xGa_{1-x}N$, where x is in a range of approximately 0.1 to approximately 0.95 at different positions in the buffer layer 303 (e.g., at a bottom of the buffer layer the chemical formula is $Al_{0.75}Ga_{0.25}N$, in the middle $Al_{0.5}Ga_{0.5}N$, and at the top $Al_{0.25}Ga_{0.75}N$). In some embodiments, the AlGaN layer may have a thickness in a range of between approximately 150 nm to approximately 1200 nm and it may not be graded.

A heterojunction structure 411, which comprises a first III-N layer 408 and a second III-N layer 410, is then formed above the buffer layer 407. In the illustrated embodiment, the first III-N layer 408 comprises GaN and the second III-N layer 410 comprises AlGaN. The GaN layer may comprise a doped GaN (UID-GaN) layer, usually referred as unintentionally doped (e.g., a GaN material not having intentionally placed dopants, but rather having a doping resulting from process contaminants, for example). In one embodiment, the UID-GaN layer may have an n-type doping. The second III-N layer 410 or layer that supplies electrons to the 2DEG channel is located directly on top of the first III-N layer, such that the top surface of the first III-N layer 408 and the bottom surface of the electron supply layer 410 abut each other. The second III-N layer comprises a material having a band gap unequal to (e.g., larger than) that of the underlying first III-N layer so that a heterojunction, which serves as the HEMT device channel, is formed at the interface of the first III-N layer 408 and second III-N layer 410. In the illustrated embodiment, the heterojunction causes the AlGaN layer 410 to supply electrons to a two-dimensional electron gas (2-DEG) (not shown) located along the interface between the GaN layer 408 and the AlGaN layer 410. The 2-DEG has high mobility electrons that are not bound to any atom, but that are free to move between the source and drain terminals of the GaN transistor device.

Figure 4B:
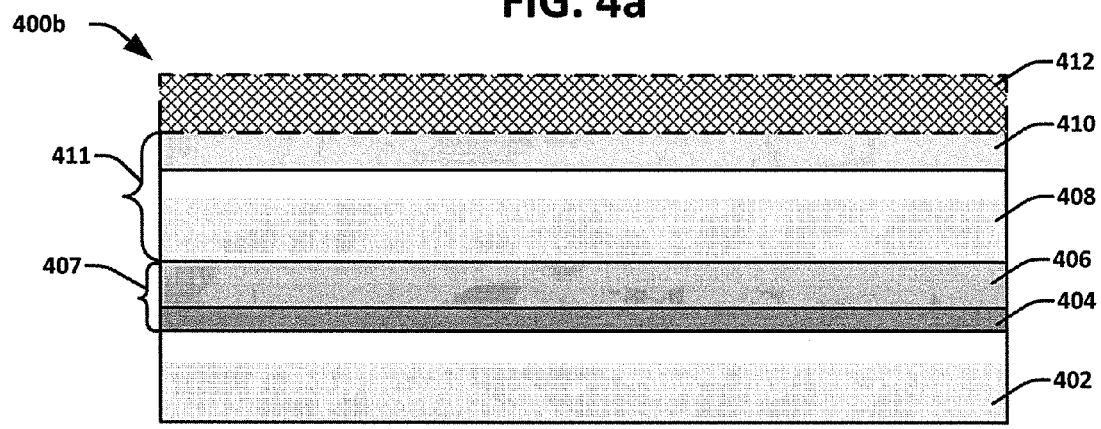

FIG. 4b shows some embodiments of a cross sectional view of a semiconductor body 400b, wherein a hybrid passivation layer 412 has been formed to abut the top surface of the second III-N layer 410. Surface passivation of AlGaN/GaN HEMTs reduces or eliminates the surface effects responsible for degrading device performance such as, drain current degradation, larger threshold voltage (Vt) fluctuation, larger off-current leakage, etc. due to the presence of slow-acting trapping states between the gate and drain of the device. The hybrid passivation layer passivates the surface by providing a coherent termination of the surface bonds. The first layer of the hybrid passivation layer (H2O based) provides a good interface with the III-N layer by reducing the density of interfacial trap states and the second layer (O3/O2-based) of the hybrid passivation layer provides good bulk properties such as resistance against dopant diffusion, thermal stability, maintenance of a high mobility of charge carriers in the channel etc. Furthermore, the hybrid passivation layer could provide higher potential barrier between the Schottky and the channel, which suppresses the thermionic emission, tunneling at high temperature, and keeps the gate voltage swing reasonably large for proper operation.

Figure 4C:
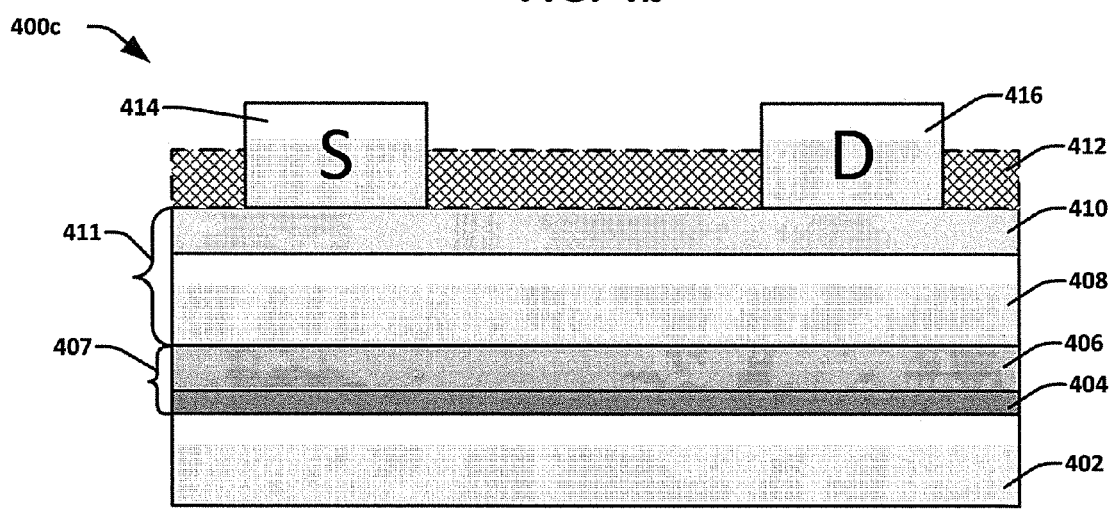

FIG. 4c shows some embodiments of a cross sectional view of a semiconductor body 400c after the formation of source and drain metal contacts. A source metal contact or source region 414 and a drain metal contact or drain region 416 are formed at first and second regions (e.g., opposing ends) of the second III-N layer 410. In some embodiments, the source and drain contacts can extend deeper in to the electron supply layer and reside at some level within the depth of the second III-N layer or extend further in to the 2DEG channel at the interface between the first III-N layer 408 and the second III-N layer 410. In some embodiments, the source contact 414 and the drain contact 416 are formed by selectively depositing a metal, by way of a deposition process (e.g., PVD, CVD, etc.), onto the substrate at a position in contact with the heterojunction (e.g., with an uppermost GaN layer 305) so as to form an ohmic contact with a two-dimensional electron gas (2DEG) located at an interface between the GaN layer 408 and the AlGaN layer 410. Materials of the source 414 and drain 416 regions are generally annealed after formation. The hybrid passivation layer 412 must be removed/etched away, in those areas where the source contact 414 and the drain contact 416 are formed, before depositing the source and drain metals.

Figure 4D:
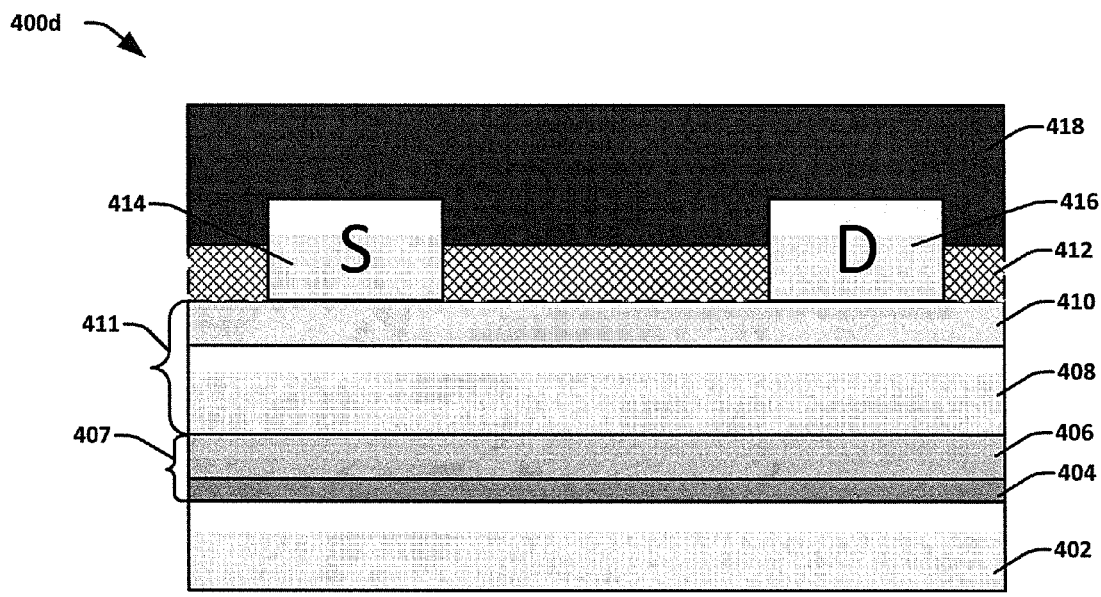

FIG. 4d shows some embodiments of a cross sectional view of a semiconductor body 400d after the formation of a cap layer 418. The cap layer 418 is deposited all over the semiconductor body covering the hybrid passivation layer and the source and drain contacts.

Figure 4E:
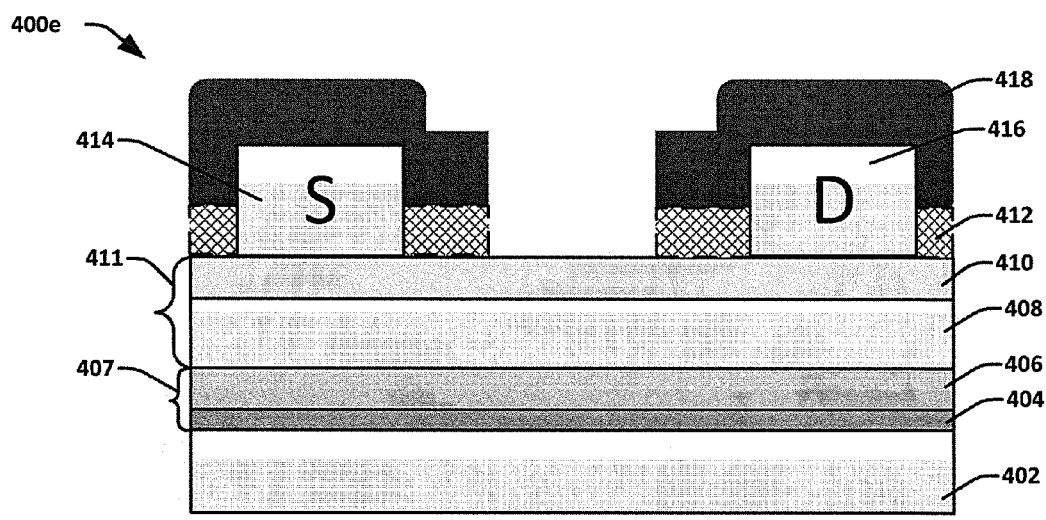

FIG. 4e shows some embodiments of a cross sectional view of a semiconductor body 400e after defining the gate region. The gate region is defined in between the source and drain regions, by patterning and etching the cap layer 418 and the hybrid passivation layer 412 in the desired gate location.

FIG. 4f shows some embodiments of a cross sectional view of a semiconductor body 400f after the formation of the hybrid gate dielectric layer 420 on the second III-N layer 410 in the gate region and over the top surface of the cap layer 418 in the remaining regions. The hybrid gate dielectric layer 420 comprises a relatively thin H2O based first dielectric layer and a relatively thick O3/O2 based second dielectric layer that resides on top of the first dielectric layer. In some embodiments, the hybrid gate dielectric layer could be an ALD-oxide (e.g. Al2O3), which may be formed in a single chamber with the same precursor (e.g., TMA) and different reactants (e.g., H2O, O3, O2-plasma). The first dielectric layer has a thickness in a range of about 1 nm to about 20 nm and the second dielectric layer has a thickness in a range of about 10 nm to about 50 nm. In various embodiments, the hybrid gate dielectric layer 124 may comprise Ga2O3, SiO2, Al2O3, MgO, Ga2O3, La2O3, HfO2, ZrO2, Y2O3, Gd2O3, Ce2O3, Ta2O3 or Ta2O5 with two different H/OH contents and thicknesses.

FIG. 4g shows some embodiments of a cross sectional view of a semiconductor body 400g after the formation of a gate electrode. A gate electrode 422 is formed by depositing a gate metal in the defined gate region. In some embodiments, the gate electrode 422 is formed by selectively depositing a metal, by way of a deposition process (e.g., PVD, CVD, etc.).

Figure 5A:
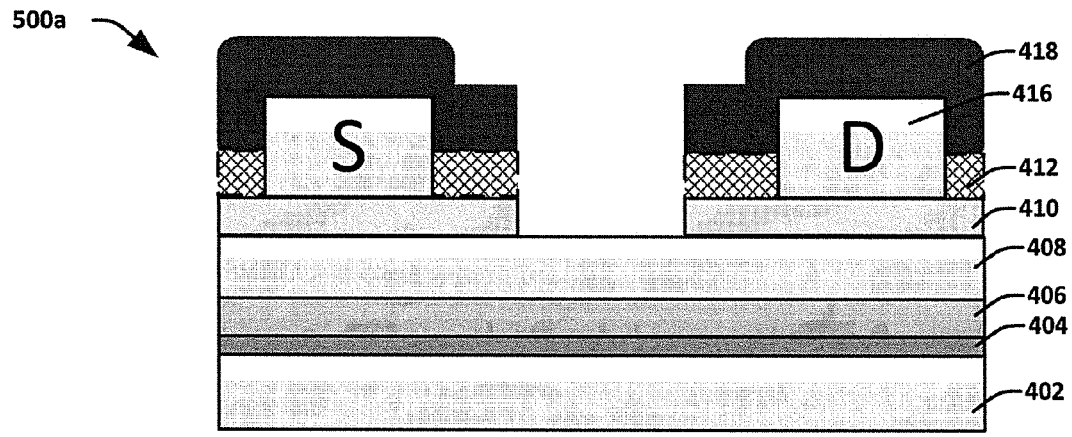
FIGS. 5a-5c show a series of cross-sectional views that collectively depict the final stages (where the initial stages are same as FIGS. 4a-4d), for manufacturing an enhancement mode (e-mode) high electron mobility transistor (HEMT) device having a hybrid gate dielectric layer and a hybrid passivation layer according to some embodiments of the disclosure.
Figure 5B:
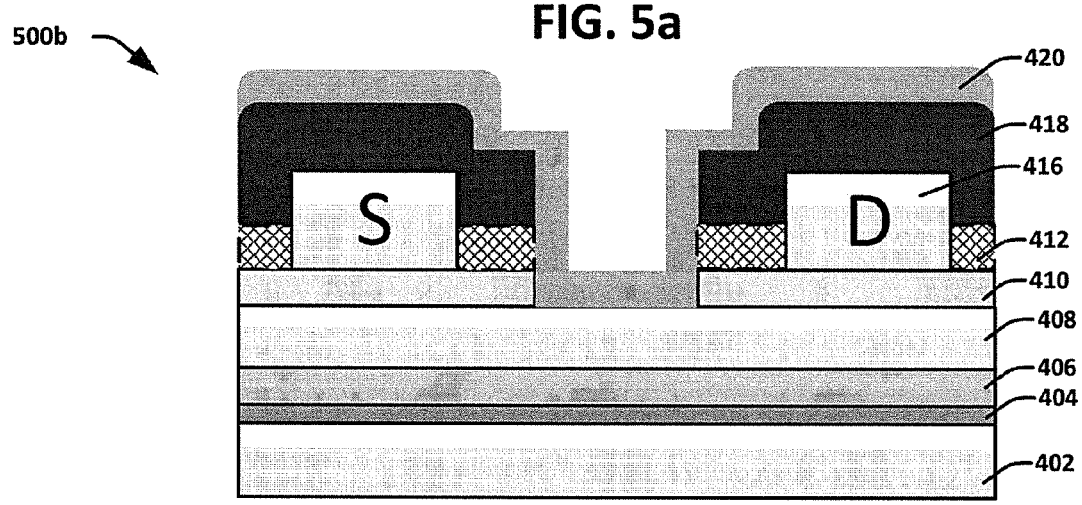
Figure 5C:
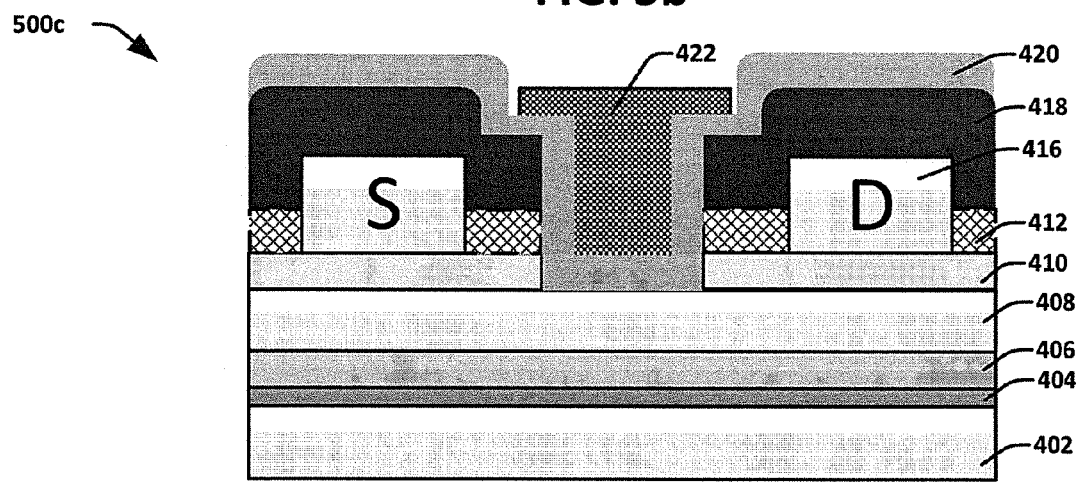

FIGS. 5a-5c show a series of cross-sectional views that collectively depict the final steps for manufacturing an enhancement mode (e-mode) high mobility transistor (HEMT) device having a hybrid gate dielectric layer according to some embodiments of the disclosure. In order to apply AlGaN/GaN HEMTs to the high-power switching system, normally off or e-mode HEMTs are indispensable, to realize failsafe system to avoid the problem of circuit burn out when the gate signal becomes ground voltage. The initial steps and figures for forming an enhancement mode HEMT replicates steps 302-312 of method 300 and FIGS. 4a-4d of the cross-sectional images.

FIG. 5a shows some embodiments of a cross sectional view of a semiconductor body 500a after defining a recessed-gate region for an e-mode (normally off) HEMT or MISFET (metal-insulator-semiconductor field-effect transistor). Here, the second III-N (AlGaN) layer 410 is also etched away/removed in the gate region in the gate defining step. When the surface polarization due to the AlGaN layer disappears, the conduction band of underlying GaN layer which relates to electron transportation, moves away from fermi-level and make the channel become normally-off. With this structure, the threshold voltage can be increased with the reduction of two-dimensional electron gas (2DEG) density only under the gate electrode without reduction of 2DEG density in the other channel regions such as the channel between drain and gate. In some embodiments, anisotropic/selective etching techniques like reactive ion etching (RIE), with inductively coupled (ICP-RIE) techniques, ALE technique with O2 and boron trichloride (BCl3) plasmas could be used to define the recessed gate region. Recess etching is also critical because it determines the leakage current of the HEMT.

FIG. 5b shows some embodiments of a cross sectional view of a semiconductor body 500b after deposition of the hybrid gate dielectric layer. The hybrid gate dielectric layer on top of the III-N surface in the gate region makes sure there is no gate leakage since the O3/O2-plasma based portion of the hybrid gate dielectric has good bulk properties. Furthermore, the interface is clean with very less surface traps due to the relatively thin H2O-based portion of the hybrid gate dielectric layer. The hybrid gate dielectric layer is also deposited above the cap layers to provide better insulation.

FIG. 5c shows some embodiments of a cross sectional view of a semiconductor body 500c after formation of the gate electrode. In some embodiments, the gate electrode 422 is formed by selectively depositing a metal, by way of a deposition process (e.g., PVD, CVD, etc.).

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a hybrid gate dielectric layer that can be formed by first depositing a H2O-based ALD-oxide layer to form a good interface with the III-N surface, followed by O3 (ozone)- or O2 plasma-based ALD-oxide which has good bulk properties. This technique can also be implemented on any passivation layers that are in contact with III-N surfaces. Thus, a good interface and other practical important properties of the gate dielectric and/or passivation layer can be realized by introducing this hybrid oxide layer.

In some embodiments, the present disclosure relates to a III-N (tri nitride) semiconductor device, comprising, a buffer layer disposed above a substrate, a crystalline or poly crystalline III-N layer disposed above the buffer layer, a source region located at a first location in/on the crystalline or poly crystalline III-N layer, a drain region located at a second location in/on the crystalline or poly crystalline III-N layer, wherein the second location is laterally disposed and separated from the source region, a gate region located at a third location on the crystalline or poly crystalline III-N layer, wherein the third location is laterally disposed between the source region and the drain region, and a hybrid gate dielectric layer disposed directly above the crystalline or poly crystalline III-N layer in the gate region.

In some embodiments, the present disclosure relates to A III-nitride high electron mobility transistor (HEMT) device comprising, an aluminum nitride (AlN) buffer layer disposed on a substrate, a first aluminum gallium nitride (AlGaN) layer disposed on the AlN buffer layer, a gallium nitride (GaN) layer disposed on the first AlGaN layer, a second aluminum gallium nitride (AlGaN) layer disposed on the GaN layer, a source region located at a first location in/on the second AlGaN layer, a drain region located at a second location in/on the second AlGaN layer, wherein the second location is laterally disposed and separated from the source region, a gate region located at a third location on the second AlGaN layer or the GaN layer, wherein the third location is laterally disposed between the source region and the drain region, and a hybrid gate dielectric layer having two portions, wherein the first portion has an H/OH content that differs from an H/OH content of the second portion, is disposed directly above the GaN or second AlGaN layer in the gate region.

In some embodiments, the present disclosure relates to a method of forming a III-nitride (III-N) high electron mobility transistor (HEMT) device, comprising, forming a first buffer layer on top of a substrate, forming a second buffer layer on top of the first buffer layer, forming a first III-N layer on top of the second buffer layer; forming a second III-N layer on top of the first III-N layer, forming a source region at a first location of the second III-N layer, forming a drain region at a second location of the second III-N layer, wherein the second location is laterally disposed and separated from the source region, forming a gate region at a third location of the first or second III-N layer, wherein the third location is laterally disposed between the source region and the drain region, and forming a hybrid gate dielectric layer having two portions, wherein the first portion has an H/OH content that differs from an H/OH content of the second portion, directly above the first or second III-N layer in the gate region.

What is claimed is:

1. A III-N (tri nitride) semiconductor device, comprising:
   a buffer layer disposed above a substrate;
   a crystalline or poly crystalline III-N layer disposed above the buffer layer;
   a source region located at a first location in or on the crystalline or poly crystalline III-N layer;
   a drain region located at a second location in or on the crystalline or poly crystalline III-N layer, wherein the second location is laterally disposed and separated from the source region;
   a gate region located at a third location on the crystalline or poly crystalline III-N layer, wherein the third location is laterally disposed between the source region and the drain region; and
   a hybrid gate dielectric layer disposed directly above the crystalline or poly crystalline III-N layer in the gate region, wherein the hybrid gate dielectric layer comprises a first dielectric layer and a second dielectric layer arranged over the first dielectric layer, the first dielectric layer having a first hydrogen to hydroxide ratio and the second dielectric layer having a second hydrogen to hydroxide ratio, the first hydrogen to hydroxide ratio being different than the second hydrogen to hydroxide ratio.

2. The semiconductor device of claim 1, wherein the first hydrogen to hydroxide ratio is higher than the second hydrogen to hydroxide ratio.

3. The semiconductor device of claim 2, wherein the first dielectric layer has a thickness in a range of about 1 nm to about 20 nm and the second dielectric layer has a thickness in a range of about 10 nm to about 50 nm.

4. The semiconductor device of claim 1, further comprising:
   a hybrid passivation layer which is disposed directly above the crystalline or poly crystalline III-N layer, in regions between the source, drain and gate.

5. The semiconductor device of claim 4, wherein the hybrid passivation layer comprises a first passivation layer and a second passivation layer, wherein the first passivation layer has higher H/OH content than the second passivation layer, and wherein the second passivation layer comprises one or more kinds of oxides stacked on top of the first passivation.

6. The semiconductor device of claim 5, wherein the first passivation layer has a thickness in a range of about 1 nm to about 20 nm and the second passivation layer has a thickness in a range of about 10 nm to about 150 nm.

7. The semiconductor device of claim 1, wherein the hybrid gate dielectric layer comprises $Ga_2O_3$, $SiO_2$, $Al_2O_3$, $MgO$, $Ga_2O_3$, $La_2O_3$, $HfO_2$, $ZrO_2$, $Y_2O_3$, $Gd_2O_3$, $Ce_2O_3$, $Ta_2O_3$ or $Ta_2O_5$.

8. A III-nitride (III-N) high electron mobility transistor (HEMT) device comprising:
   an aluminum nitride (AlN) buffer layer disposed on a substrate;
   a first aluminum gallium nitride (AlGaN) layer disposed on the AlN buffer layer;
   a gallium nitride (GaN) layer disposed on the first AlGaN layer;
   a second aluminum gallium nitride (AlGaN) layer disposed on the GaN layer;
   a source region located at a first location in or on the second AlGaN layer;
   a drain region located at a second location in or on the second AlGaN layer, wherein the second location is laterally disposed and separated from the source region;
   a gate region located at a third location on the second AlGaN layer or the GaN layer, wherein the third location is laterally disposed between the source region and the drain region; and
   a hybrid gate dielectric layer disposed directly above the GaN or second AlGaN layer in the gate region and having first and second portions, wherein the first and second portions have first and second hydrogen to hydroxide ratios, respectively, the first and second hydrogen to hydroxide ratios differing from one another.

9. The HEMT device of claim 8, further comprising:
   a hybrid passivation layer disposed directly above the second AlGaN layer between the source, drain and gate regions;
   a cap layer disposed above the hybrid passivation layer, the source region and the drain region; and
   a gate electrode disposed directly above the hybrid gate dielectric layer in the gate region.

10. The HEMT device of claim 9, wherein the hybrid gate dielectric layer is also disposed above the cap layer.

11. The HEMT device of claim 8, wherein the hybrid gate dielectric layer has a larger band gap than the second AlGaN layer or the GaN layer underneath.

12. The HEMT device of claim 8, wherein the hybrid gate dielectric layer comprises:
   a first dielectric layer comprising a H2O-based atomic layer deposited (ALD) oxide; and
   a second dielectric layer comprising an O3/O2 plasma-based ALD oxide, wherein the second dielectric layer resides on top of the first dielectric layer.

13. A III-N (tri nitride) semiconductor device, comprising:
   a heterojunction structure disposed over a semiconductor substrate and including a first III-N layer abutting a second III-N layer, wherein the second III-N layer is disposed over the first III-N layer and differs from the first III-N layer in its chemical composition;
   a source region and a drain region which are disposed over an upper region of the second III-N layer and which are spaced apart from one another;
   a gate electrode disposed over the heterojunction structure in a gate region, wherein the gate region is laterally disposed between the source and drain regions;
   a hybrid passivation layer disposed directly over the upper region of the second III-N layer on either side of the source, drain regions except in the gate region, wherein the hybrid passivation layer comprises first and second passivation layers having first and second hydrogen to hydroxide ratios, respectively, wherein the first and second hydrogen to hydroxide ratios differ from one another; and
   a hybrid gate dielectric layer disposed directly over the upper region of the second III-N layer, in the gate region.

14. The III-N semiconductor device of claim 13, wherein the hybrid gate dielectric layer comprises a first dielectric layer and a second dielectric layer, wherein the first dielectric layer has a higher hydrogen to hydroxide ratio than the second dielectric layer, and wherein the second dielectric layer, resides on top of the first dielectric layer.

15. The III-N semiconductor device of claim 13, wherein the first hydrogen to hydroxide ratio is higher than the second hydrogen to hydroxide ratio, and wherein the second passivation layer, resides on top of the first passivation layer.

16. The III-N semiconductor device of claim 14, wherein the first dielectric layer comprises a H2O-based atomic layer deposited (ALD) oxide; and the second dielectric layer comprises an O3/O2 plasma-based ALD oxide.

17. The III-N semiconductor device of claim 13, further comprising a cap layer disposed above the hybrid passivation layer, the source region and the drain region.

18. The III-N semiconductor device of claim 17, wherein the hybrid gate dielectric layer extends over the cap layer.

19. The III-N semiconductor device of claim 14, wherein the hybrid gate dielectric layer having two layers and comprises $Ga_2O_3$, $SiO_2$, $Al_2O_3$, $MgO$, $Ga_2O_3$, $La_2O_3$, $HfO_2$, $ZrO_2$, $Y_2O_3$, $Gd_2O_3$, $Ce_2O_3$, $Ta_2O_3$ or $Ta_2O_5$, wherein the two layers have an H/OH content that differs from one another.

20. The III-N semiconductor device of claim 13, wherein the hybrid gate dielectric layer has a larger band gap than the first or second III-N layer.

* * * * *